United States Patent
Harley et al.

(10) Patent No.: US 9,493,877 B1
(45) Date of Patent: Nov. 15, 2016

(54) ETCHING TECHNIQUE FOR MICROFABRICATION SUBSTRATES

(71) Applicant: Innovative Micro Technology, Goleta, CA (US)

(72) Inventors: John Harley, Santa Barbara, CA (US); Jeffery F. Summers, Santa Barbara, CA (US); Tao Gilbert, Goleta, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 15/144,735

(22) Filed: May 2, 2016

(51) Int. Cl.
*C23F 1/02* (2006.01)
*C23F 4/00* (2006.01)
*C23F 1/12* (2006.01)
*H01J 37/32* (2006.01)
*C23F 1/16* (2006.01)
*C23F 1/38* (2006.01)
*C23F 1/44* (2006.01)
*B81C 1/00* (2006.01)
*G03F 7/004* (2006.01)

(52) U.S. Cl.
CPC . *C23F 1/02* (2013.01); *C23F 1/12* (2013.01); *C23F 4/00* (2013.01); *H01J 37/32009* (2013.01); *B81C 1/00531* (2013.01); *B81C 1/00539* (2013.01); *C23F 1/16* (2013.01); *C23F 1/38* (2013.01); *C23F 1/44* (2013.01); *G03F 7/0041* (2013.01); *H01J 2237/334* (2013.01)

(58) Field of Classification Search
CPC ............... H01J 37/32009; H01J 2237/334; C23F 4/00; C23F 1/12; C23F 1/16; C23F 1/38; C23F 1/44; C23F 1/02; B81C 1/00531; B81C 1/00539; G03F 7/0041
See application file for complete search history.

(56) References Cited

U.S. PATENT DOCUMENTS

| | | | | |
|---|---|---|---|---|
| 5,529,954 A | * | 6/1996 | Iijima | H01L 21/28512 148/DIG. 15 |
| 6,998,696 B2 | * | 2/2006 | Casper | H01L 21/4846 257/528 |
| 2003/0104649 A1 | * | 6/2003 | Ozgur | B81C 1/00246 438/50 |
| 2011/0140209 A1 | * | 6/2011 | Wang | G01N 21/658 257/414 |
| 2014/0357055 A1 | * | 12/2014 | Gissibl | H01L 21/30604 438/462 |

* cited by examiner

*Primary Examiner* — Anita Alanko
(74) *Attorney, Agent, or Firm* — Jaquelin K. Spong

(57) ABSTRACT

A method for creating small features in an Al/Ag/Ti multilayer stack is disclosed. The method uses a combination of wet and dry etching techniques to anisotropically etch the layers.

1 Claim, 2 Drawing Sheets

ETCHING TECHNIQUE FOR MICROFABRICATION SUBSTRATES

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a methodology for etching microfabrication substrates.

In microfabrication, the problem often arises of etching through a stack that contains alumina, silver, and titanium. One possible fabrication technique is wet etching that combines HF (etches alumina), hydrogen peroxide (oxidizes Ag and Ti), and ammonia (dissolves AgO into an aqueous ionic solution.) Features approximately 10 microns in characteristic dimensions may be made using such a wet etching technique.

Using wet etching, however, to make smaller/narrower features may be problematic, because the etching tends to widen the feature until the tolerance is no longer maintained. Indeed, lateral etch rates may be almost 20× faster than the vertical etch rate through the stack. Wet etching may also etch much faster in small gaps than in wider areas, such that the final dimensions depend on the dimensions of the original feature. Agitation of the part may not affect these etch rates. It is possible that the etchant tracks along the alumina/silver interface, thus traveling laterally in the material while etching it.

Accordingly, the etching of small features in a microfabrication substrate remains an unresolved problem.

SUMMARY

According to the method disclosed here, a feature is created in an alumina/silver/titanium ($Al_2O_3$/Ag/Ti) multilayer stack on a substrate using a combination of etching techniques. Photoresist is patterned over the top alumina ($Al_2O_3$) layer in the multilayer stack. A buffered oxide etch (BOE) (10:1) is used to etch through the alumina. This creates what is essentially a very thin (500 A) hard mask. In one embodiment, the photoresist stays on, but it could be stripped at this stage. The exposed silver is then exposed to an aggressive oxygen plasma. The oxidation process that results is almost completely anisotropic in such a thin layer. The silver oxide can then be easily wet etched in ammonia. Ammonia has only a very slow attack rate on silver, but it reduces the silver oxide very aggressively. Thus, the combination of an anisotropic dry chemical reaction with an isotropic wet reaction results in an anisotropic etch.

Furthermore, using this approach, both large and small open areas appear to clear at approximately the same rate. The underlying Ti can be etched in a variety of ways, including $SF_6$ reactive ion etching (RIE). Care needs to be taken in the selection of this method, as most things that etch Ti also etch Ag, and the etch rates on the Ag may be much faster than the Ti.

These and other features and advantages are described in, or are apparent from, the following detailed description.

BRIEF DESCRIPTION OF THE DRAWINGS

Various exemplary details are described with reference to the following figure, wherein.

It should be understood that the drawings are not necessarily to scale, and that like numbers may refer to like features.

DETAILED DESCRIPTION

Figure 1:
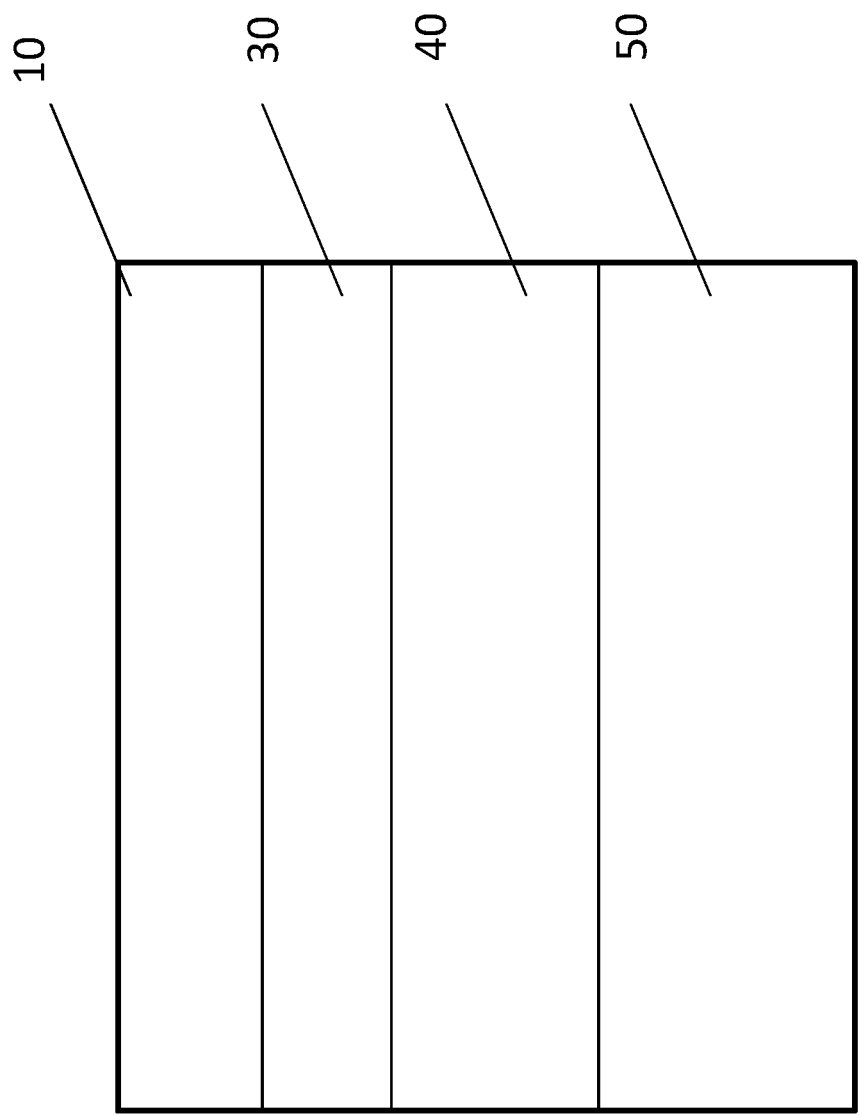
FIG. 1 is a cross sectional diagram illustrating one exemplary embodiment of the multilayer substrate.

According to the method disclosed here, a feature is created in an alumina/silver/titanium (Al/Ag/Ti) multilayer stack on a substrate using a combination of etching techniques. In the description below and as illustrated in FIG. 1, 10 refers to the top layer of alumina $Al_2O_3$, 30 refers to a layer of silver, 40 refers to a layer of titanium, and 50 is the substrate material. The layers may each be of any thickness, suitable for the application.

Photoresist is patterned over the Alumina ($Al_2O_3$) in the multilayer stack. A buffered oxide etch (BOE) (10:1) is used to etch through the alumina 10. This creates what is essentially a very thin (500 A) hard mask. In one embodiment, the photoresist stays on, but it could be stripped at this stage. The exposed silver 30 is then exposed to an aggressive oxygen plasma. The oxidation process that results is almost completely anisotropic in such a thin layer. The silver oxide can then be easily wet etched in ammonia. Ammonia has only a very slow attack rate on silver, but it reduces the silver oxide very aggressively. Thus, the combination of an anisotropic dry chemical reaction with an isotropic wet reaction results in an anisotropic etch. Furthermore, using this approach, both large and small open areas appear to clear at approximately the same rate. The underlying Ti 40 can be etched in a variety of ways, including $SF_6$ reactive ion etching (RIE). Care needs to be taken in the selection of this method, as most things that etch Ti also etch Ag, and the etch rates on the Ag may be much faster than the Ti. This process will leave the desired feature in the $Al_2O_3$/Ag/Ti multilayer over the substrate 50.

Figure 2:
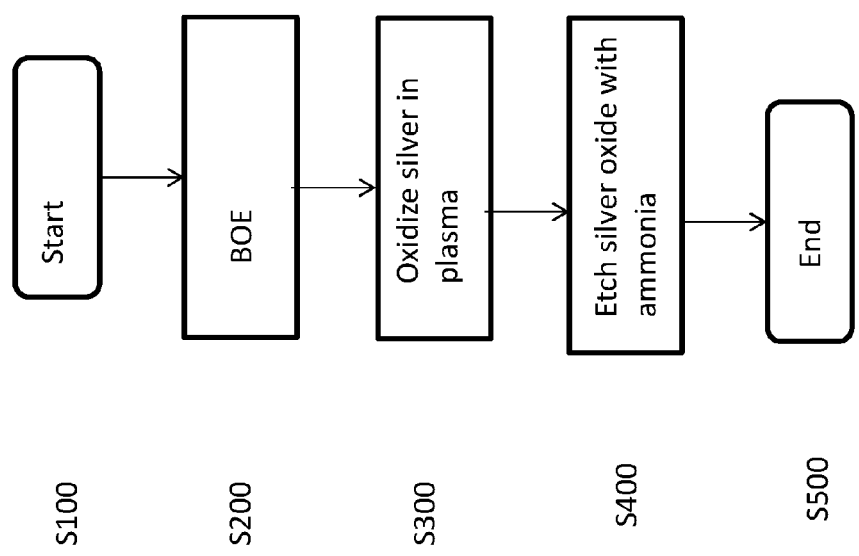
FIG. 2 is a flowchart illustrating one exemplary embodiment of the method.

FIG. 2 is a flowchart illustrating an exemplary method. The method begins in step S100. In step S200, the alumina is etched in a BOE. In step S300, the silver is exposed to an oxidizing plasma. In step S400 the silver oxide is removed with ammonia. The process ends in step S500. It should be understood that some steps may be omitted as they are well known to those of ordinary skill in the art, such as the deposition and patterning of photoresist.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. While the embodiment described above relates to two bonded optically transparent substrates, it should be understood that the techniques and designs described above may be applied to any of a number of other materials, including optically opaque materials.

Accordingly, the exemplary implementations set forth above, are intended to be illustrative, not limiting.

What is claimed is:

1. An etching method for an alumina/silver/titanium multilayer stack, comprising:
    applying a buffered oxide etch to etch through alumina;
    applying an oxygen plasma to the exposed silver to form silver oxide; and
    etching the silver oxide with ammonia.

* * * * *